United States Patent
Chou et al.

(10) Patent No.: US 10,461,497 B1
(45) Date of Patent: Oct. 29, 2019

(54) LIGHT EMITTING DEVICE AND MANUFACTURING METHOD THEREOF

(71) Applicants: Interface Technology (ChengDu) Co., Ltd., Sichuan (CN); Interface Optoelectronics (ShenZhen) Co., Ltd., Guangdong (CN); General Interface Solution Limited, Miaoli County (TW)

(72) Inventors: Hsien-Ying Chou, Guangdong (CN); Chun-Ta Chen, Guangdong (CN); Fu-Cheng Wei, Guangdong (CN); Chih-Lin Liao, Guangdong (CN)

(73) Assignees: INTERFACE TECHNOLOGY (CHENGDU) CO., LTD., Sichuan (CN); INTERFACE OPTOELECTRONICS (SHENZHEN) CO., LTD., Guangdong (CN); GENERAL INTERFACE SOLUTION LIMITED, Miaoli County (TW)

( * ) Notice: Subject to any disclaimer, the term of this patent is extended or adjusted under 35 U.S.C. 154(b) by 0 days.

(21) Appl. No.: 16/233,112

(22) Filed: Dec. 27, 2018

(30) Foreign Application Priority Data

Sep. 3, 2018 (CN) .......................... 2018 1 1020245

(51) Int. Cl.
| | |
|---|---|
| *H01S 5/00* | (2006.01) |
| *H01S 5/022* | (2006.01) |
| *H01S 5/183* | (2006.01) |
| *H01S 5/02* | (2006.01) |
| *H01S 5/24* | (2006.01) |

(52) U.S. Cl.
CPC .......... *H01S 5/02296* (2013.01); *H01S 5/021* (2013.01); *H01S 5/0207* (2013.01); *H01S 5/02252* (2013.01); *H01S 5/02256* (2013.01); *H01S 5/02288* (2013.01); *H01S 5/183* (2013.01); *H01S 5/24* (2013.01)

(58) Field of Classification Search
CPC .. H01S 5/183; H01S 5/02252; H01S 5/02288; H01S 5/02296; H01S 5/02256; H01S 5/24; H01S 5/0207; H01S 5/021
See application file for complete search history.

(56) References Cited

U.S. PATENT DOCUMENTS

| | | | | |
|---|---|---|---|---|
| 5,783,844 | A * | 7/1998 | Kobayashi | G02B 6/125 257/103 |
| 9,535,521 | B2 * | 1/2017 | Chang | G06F 3/041 |
| 10,290,996 | B1 * | 5/2019 | Mathai | H01S 5/18305 |
| 2005/0250234 | A1 * | 11/2005 | Kamikawa | H01S 5/2231 438/47 |
| 2007/0091962 | A1 * | 4/2007 | Murakami | H01S 5/18311 372/50.124 |
| 2013/0001621 | A1 * | 1/2013 | Shiu | H01L 27/14618 257/98 |
| 2014/0349383 | A1 * | 11/2014 | Ota | G01N 21/645 435/288.7 |

* cited by examiner

*Primary Examiner* — Kinam Park

(74) *Attorney, Agent, or Firm* — CKC & Partners Co., LLC

(57) ABSTRACT

A light emitting device includes a substrate, a light emitting element, a shielding layer, and a collimator. The light emitting element is embedded in the substrate. The shielding layer is disposed on the substrate and has an opening exposing the light emitting element. The collimator is disposed on the shielding layer.

10 Claims, 7 Drawing Sheets

LIGHT EMITTING DEVICE AND MANUFACTURING METHOD THEREOF

CROSS-REFERENCE TO RELATED APPLICATION

This application claims priority to China Application Serial Number 201811020245.5, filed Sep. 3, 2018, which is herein incorporated by reference.

BACKGROUND

Field of Invention

The present invention relates to a light emitting device, and a manufacturing method of the light emitting device.

Description of Related Art

Infrared light emitting modules are typically used in 3D face recognition devices. In general, the infrared light emitting module includes a light emitting element disposed on a substrate, a collimator lens, and a diffractive optical element (DOE). In order to emit collimated light without deviating, the light emitting element, the collimator lens and the diffractive optical element must be precisely aligned with each other.

However, if the amount of adhesive used to bond the substrate, the collimator lens, and the diffractive optical element is too much or too little, or if abnormalities occur in the adhesive curing process, the light emitting element, the collimator lens, and the diffractive optical element would be misaligned. Therefore, the light emitted from the misaligned modules is deviated, resulting in an error in the subsequent image processing stage.

SUMMARY

An aspect of the present invention is to provide a light emitting device. The light emitting device includes a substrate, a light emitting element, a shielding layer, and a collimator. The light emitting element is embedded in the substrate. The shielding layer is disposed on the substrate and has an opening exposing the light emitting element. The collimator is disposed on the shielding layer.

In some embodiments of the present invention, the collimator is a light transmissive layer having a plurality of convex portions, and each of the convex portions has a curved top surface.

In some embodiments of the present invention, one of the convex portions corresponds to the opening.

In some embodiments of the present invention, each of the convex portions has a rectangular contour in a top view.

In some embodiments of the present invention, the collimator is a lens.

In some embodiments of the present invention, the lens corresponds to the opening.

In some embodiments of the present invention, the lens has circular or elliptical contour in a top view.

In some embodiments of the present invention, the light emitting element is a vertical-cavity surface-emitting laser diode.

Another aspect of the present invention is to provide a manufacturing method of a light emitting device. The method comprises: providing a precursor structure, wherein the precursor structure includes a substrate and a light emitting element embedded in the substrate; forming a shielding layer on the precursor structure, wherein the shielding layer has an opening exposing the light emitting element; and forming a collimator on the shielding layer.

In some embodiments of the present invention, the collimator is a light transmissive layer having a plurality of convex portions, and one of the convex portions is aligned with the opening; or the collimator is a lens aligned with the opening.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1A:
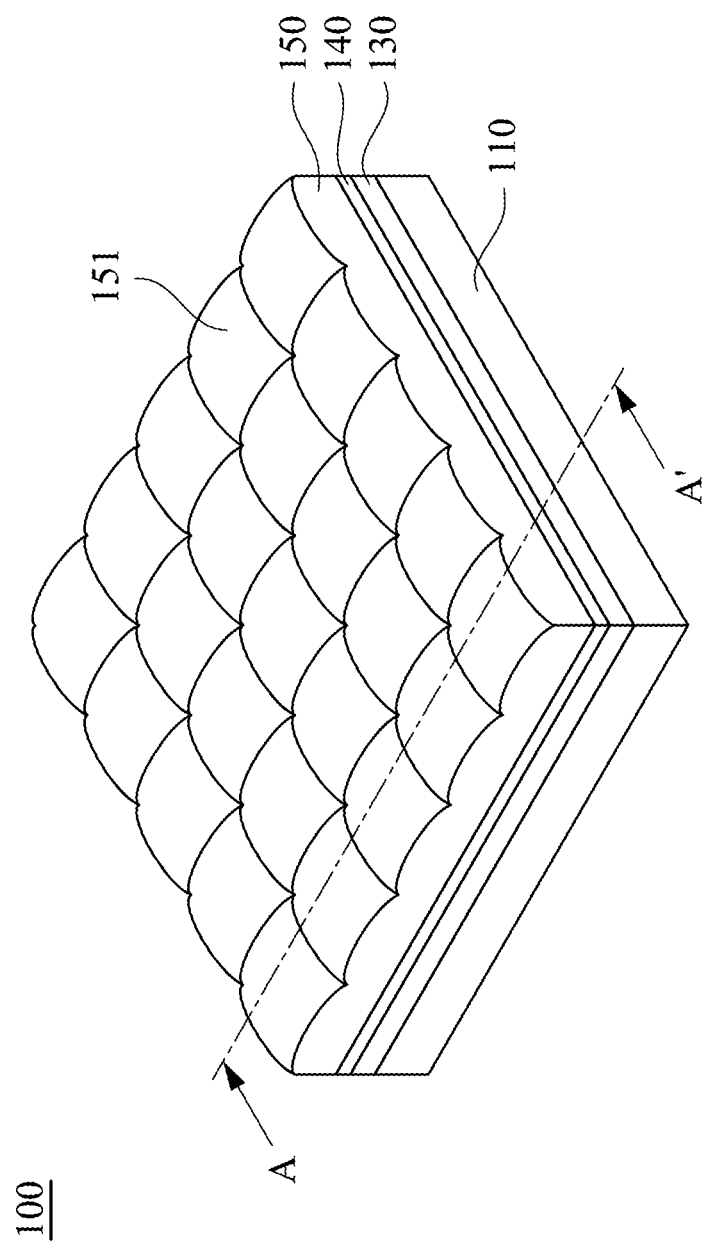
FIG. 1A is a perspective view illustrating a light emitting device according to a first embodiment of the present invention.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact. For the purpose of simplicity and clarity, different features may be depicted with different sizes.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Reference will now be made in detail to the present embodiments of the invention, examples of which are illustrated in the accompanying drawings. Wherever possible, the same reference numbers are used in the drawings and the description to refer to the same or like parts.

Figure 1B:
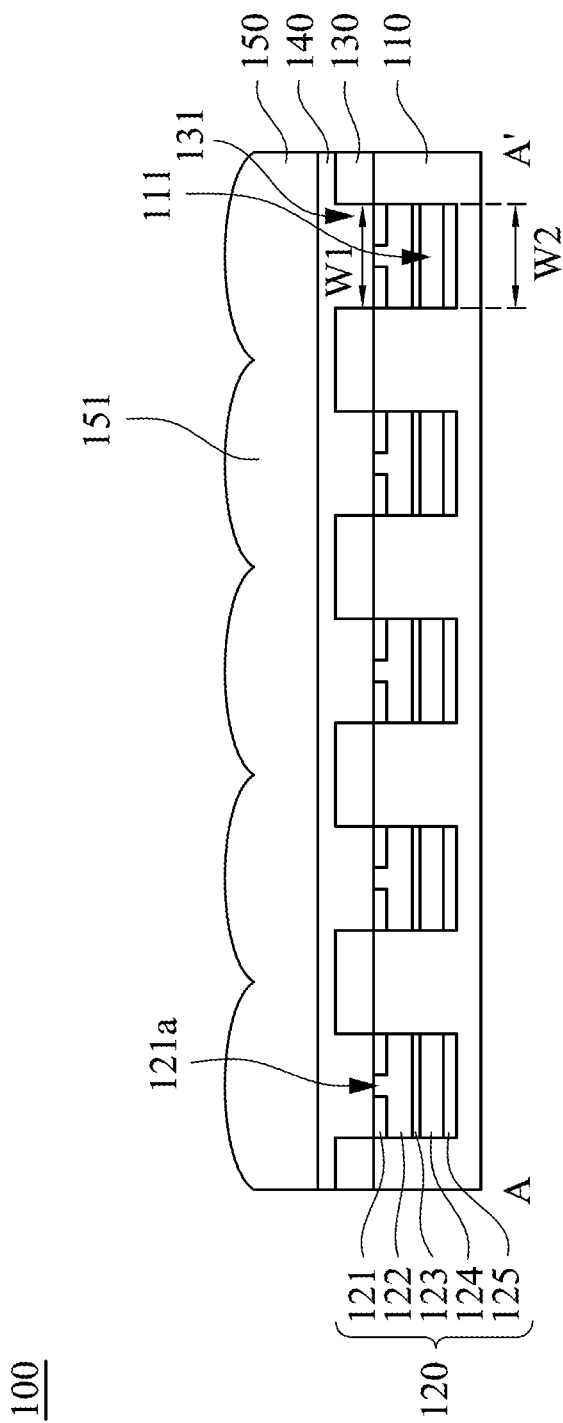
FIG. 1B is a cross-sectional view illustrating a light emitting device along line A-A' of FIG. 1A according to the first embodiment of the present invention.

Please refer to FIGS. 1A and 1B. FIG. 1A is a perspective view illustrating a light emitting device 100 according to a first embodiment of the present invention, and FIG. 1B is a cross-sectional view showing the light emitting device 100 along line A-A' of FIG. 1A.

The light emitting device 100 disclosed herein may be used as an infrared light emitting module for three-dimensional face recognition devices. As shown in FIGS. 1A and 1B, the light emitting device 100 includes a substrate 110, one or more light emitting elements 120, a shielding layer 130, a light-transmissive adhesive layer 140, and a collimator 150.

In an embodiment, the substrate 110 can be, for example, a ceramic substrate or other substrates with excellent thermal conductivity. The substrate 110 with excellent thermal conductivity can quickly dissipate the heat generated from the light emitting element 120 to avoid the light emitting element 120 from reaching a high temperature which undesirably affects the luminous efficiency and stability of the light emitting element 120. The substrate 110 has a groove 111. It should be noted that the groove 111 can achieve a certain technical effect, which will be described in detail below.

The light emitting element 120 is embedded in the groove 111 of the substrate 110. In an embodiment, the light emitting element 120 may be a vertical-cavity surface-emitting laser (VCSEL) diode, for example. The vertical-cavity surface-emitting laser diode includes a top electrode 121, a first semiconductor layer 122, a light-emitting layer 123, a second semiconductor layer 124, and a bottom electrode 125 (as shown in FIG. 1B).

The light-emitting layer 123 is interposed between the top electrode 121 and the bottom electrode 125. The first semiconductor layer 122 is interposed between the top electrode 121 and the light-emitting layer 123. The second semiconductor layer 124 is interposed between the light-emitting layer 123 and the bottom electrode 125. The first semiconductor layer 122 and the second semiconductor layer 124 may be multiple-layered structures. Furthermore, one of the first and second semiconductor layers 122, 124 is an N-type doped semiconductor layer, while the other one is a P-type doped semiconductor layer. As shown in FIG. 1B, the top electrode 121 has a hole 121a. Accordingly, the light emitted from the light-emitting layer 123 can be transmitted through the hole 121a to the outside of the light emitting element 120.

Since the light emitting element 120 is embedded in the groove 111 of the substrate 110, the heat dissipation efficiency is improved due to the increase in the contact area between the light emitting element 120 and the substrate 110 with excellent thermal conductivity. On the other hand, the total thickness of the light emitting device 100 is also reduced by embedding the light emitting element 120 in the groove 111 of the substrate 110. Although two adjacent light emitting elements 120 are not in contact with each other, the lights emitted therefrom may interfere with each other at the region between adjacent light emitting elements 120. According to the embodiments of the present invention, the interference described above can be effectively improved by the shielding layer 130, which will be described in detail below.

In an embodiment, the light emitting elements 120 are arranged in a matrix array. The arrangement of matrix array is provided for illustrative purpose only and is not intended to limit the present invention. Therefore, those skilled in the art can modify the arrangement of the light emitting elements 120, depending on actual needs.

The shielding layer 130 is disposed on the substrate 110 and has one or more openings 131 exposing the light emitting element(s) 120. The opening 131 is aligned with the light emitting element 120. In an embodiment, the width W1 of the opening 131 is the same as the width W2 of the light emitting element 120. The sidewalls of the opening 131 are aligned with the sidewalls of the light emitting element 120. In other embodiments, the width W1 of the opening 131 is greater or smaller than the width W2 of the light emitting element 120, such that the sidewalls of the opening 131 and the sidewalls of the light emitting element 120 are not aligned with each other.

The shielding layer 130 may be made of any known material that is capable of shielding the light emitted from the light emitting element 120. As described above, the lights may interfere with each other in the region between adjacent light emitting elements 120. However, according to the embodiments of the present invention, the shielding layer 130 shields the lights passing through the region between adjacent light emitting elements 120, thereby improving the above-described interference.

The light-transmissive adhesive layer 140 is disposed between the shielding layer 130 and the collimator 150. The light-transmissive adhesive layer 140 covers the shielding layer 130 and is filled in the opening 131. In one embodiment, the light-transmissive adhesive layer 140 includes an optically clear adhesive (OCA) or an optically clear resin (OCR), but is not limited thereto.

The collimator 150 is disposed on the light-transmissive adhesive layer 140. The collimator 150 is a light transmissive layer. The light transmissive layer has a plurality of convex portions 151, and the top surface of each convex portion 151 is a curved surface. Each of the convex portions 151 corresponds to at least one light emitting element 120 or at least one opening 131. Accordingly, the light passing through the collimator 150 may be collimated without being deviated, and is suitable for face recognition. In an embodiment, the profile or contour of each of the convex portions is rectangular in a top view, but is not limited thereto.

The collimator 150 may comprise any known material that is suitable for the collimator 150, such as glass, resin, and the like. Preferably, in one embodiment, the material of the collimator 150 is a photoimageable material. Therefore, the collimator 150 can be formed merely by exposure and development processes, without an etching process, so that the collimator 150 can be formed in a cost-effective manner.

Figure 2A:
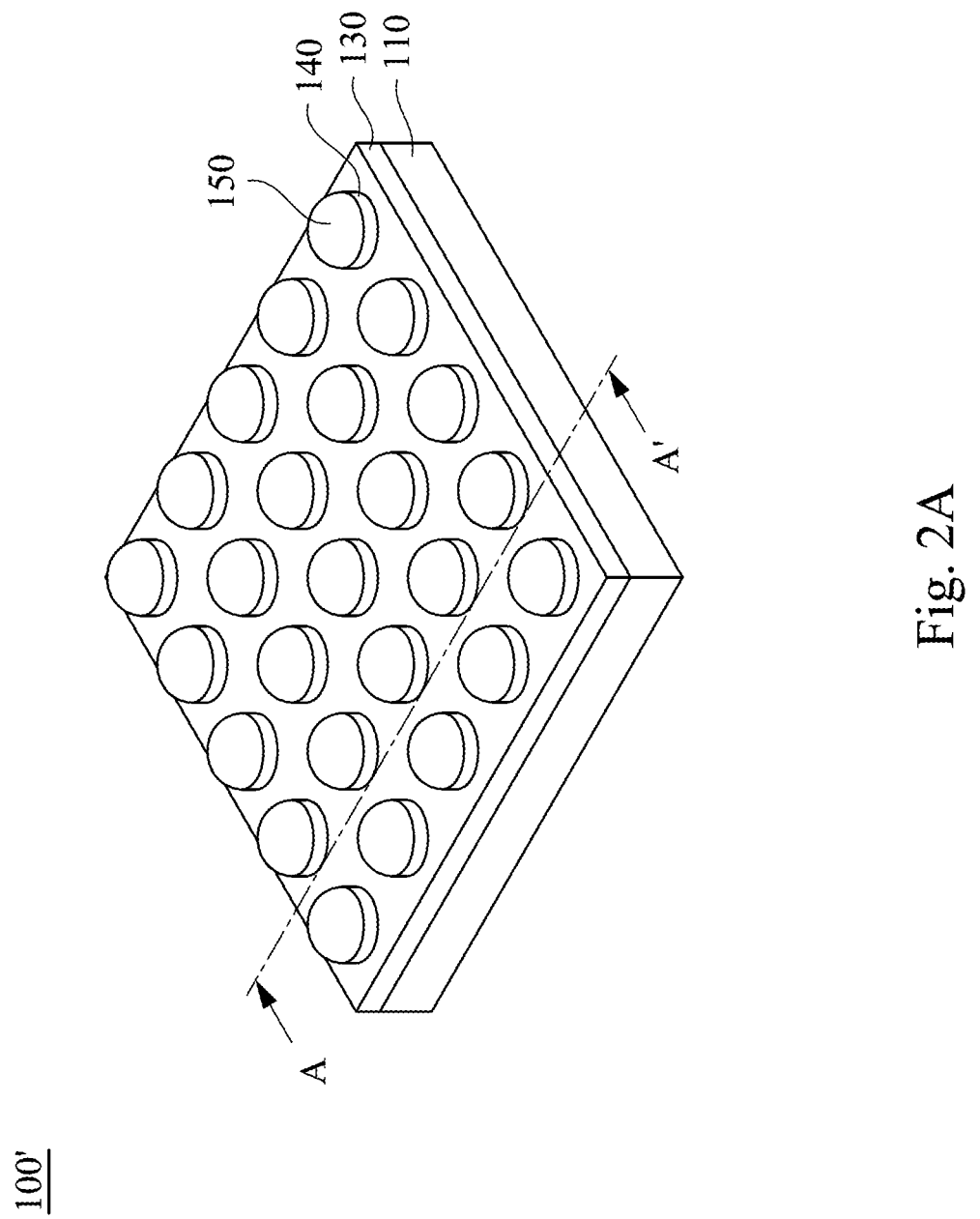
FIG. 2A is a perspective view illustrating a light emitting device according to a second embodiment of the present invention.
Figure 2B:
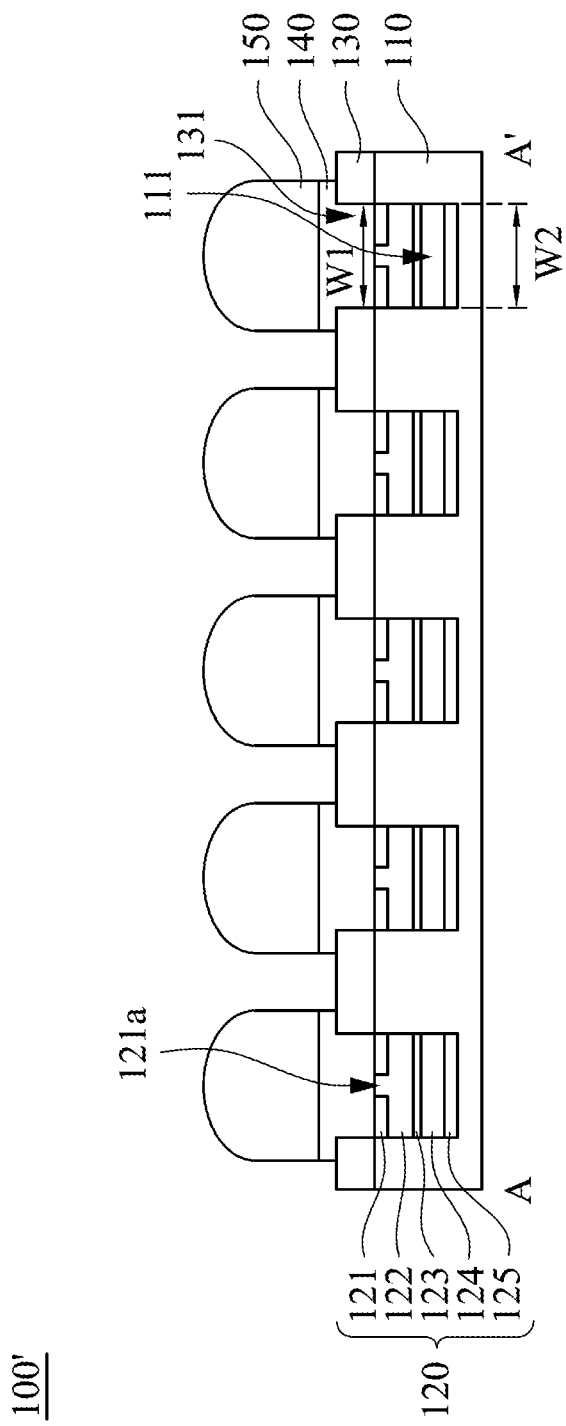
FIG. 2B is a cross-sectional view illustrating a light emitting device along line A-A' of FIG. 2A according to the second embodiment of the present invention.

Please refer to FIGS. 2A and 2B. FIG. 2A is a perspective view illustrating a light emitting device 100' according to a second embodiment of the present invention, and FIG. 2B is a cross-sectional view of the light emitting device 100' along line A-A' of FIG. 2A.

In FIGS. 2A and 2B, the same or similar elements as those in FIGS. 1A and 1B are given the same reference numerals, and the description thereof is omitted. The light emitting device 100' of FIGS. 2A and 2B is similar to the light emitting device 100 of FIGS. 1A and 1B, except that the collimator 150 of the light emitting device 100' includes a plurality of lenses separated from each other. Each lens corresponds to at least one light emitting element 120 or at least one opening 131, and the top surface of the lens is a curved surface. In an embodiment, the profile or contour of the lens in a top view may be circular or elliptical, but is not limited thereto.

A manufacturing method of the light emitting device is also provided herein. Please refer to FIGS. 3A-3C. FIGS.

3A-3C are cross-sectional views illustrating various stages of a method for fabricating a collimator according to an embodiment of the present invention.

Figure 3A:
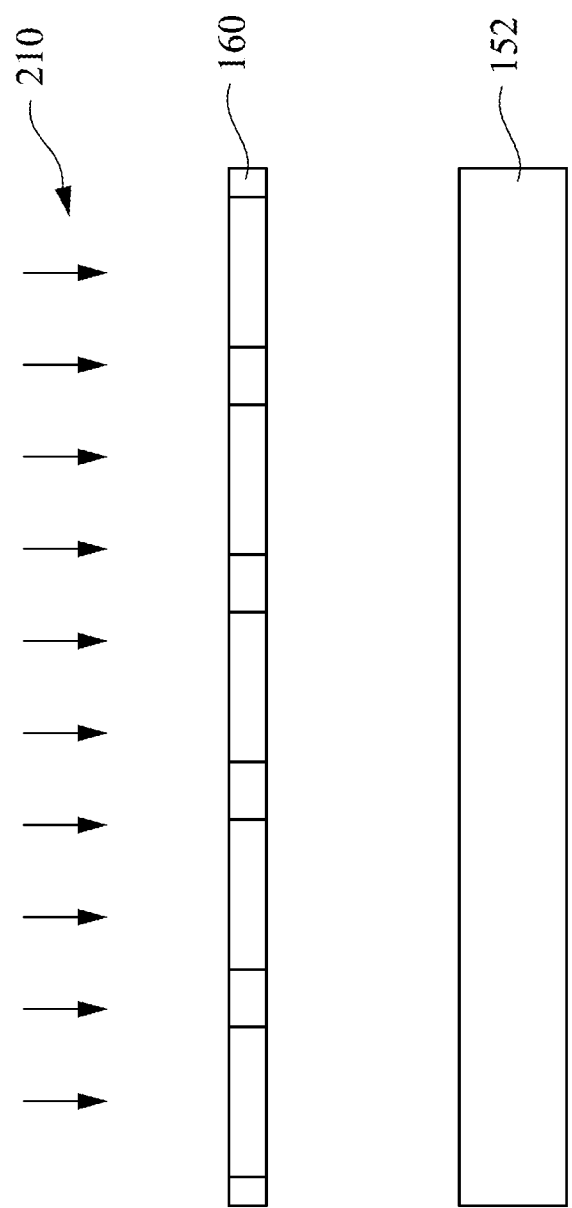
FIGS. 3A-3C are cross-sectional views illustrating various process stages of a method for manufacturing a collimator according to an embodiment of the present invention.

As shown in FIG. 3A, a photoimageable layer 152 made of a photoimageable material is provided. Next, the photoimageable layer 152 is placed under a photo mask 160. The photo mask 160 is configured to have transmission selectivity such that some portions of the photo mask 160 has a light transmittance of 80 to 100%, and some portions has a light transmittance of 0 to 20% only. Next, an exposure process 210 is performed. Specifically, the photoimageable layer 152 is exposed to the light through the photo mask 160.

Figure 3B:
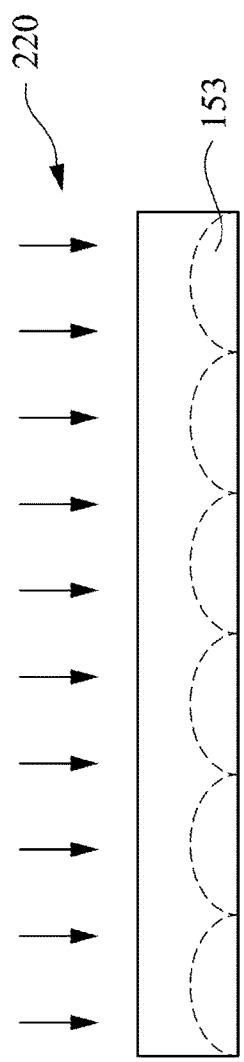

As shown in FIG. 3B, an exposed photoimageable layer 153 is formed. Next, a developing process 220 is performed. Specifically, the exposed portion of the photoimageable layer 153 may be chemically reacted with the developer, and therefore is removed.

Figure 3C:
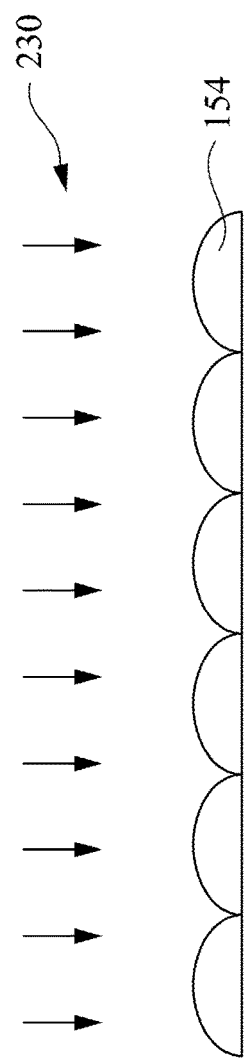

Next, as shown in FIG. 3C, a baking process 230 is performed to form a collimator 154.

Figure 4:
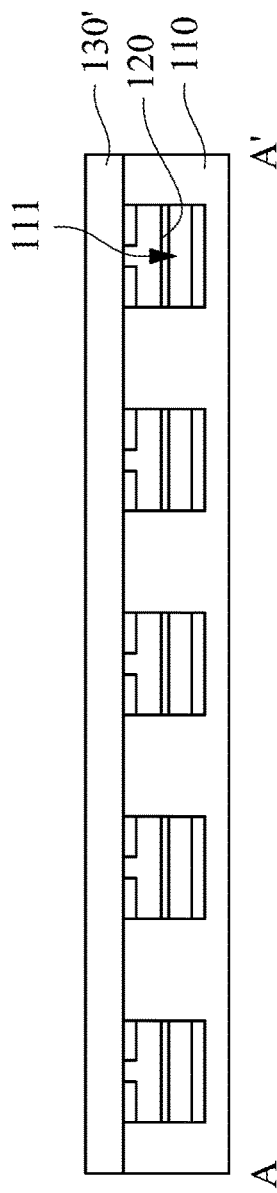
FIGS. 4-5 are cross-sectional views illustrating various stages of a method for manufacturing a light emitting device according to an embodiment of the present invention.
Figure 5:
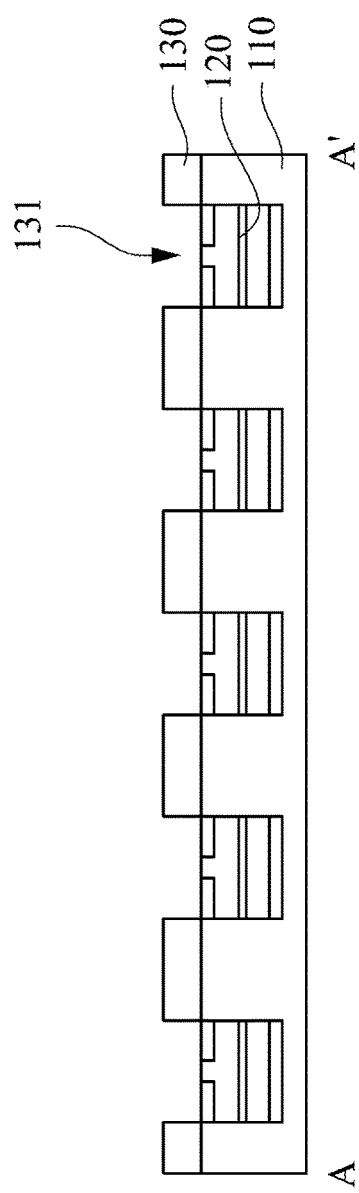

Please refer to FIGS. 4-5. FIGS. 4-5 are cross-sectional views illustrating various process stages of a method for manufacturing a light emitting device according to an embodiment of the present invention.

As shown in FIG. 4, a precursor structure is provided. The precursor structure includes a substrate 110 and a light emitting element 120. The light emitting element 120 is embedded in a groove 111 of the substrate 110. A shielding material 130' is formed overlying the precursor structure. In some examples, the method of forming the shielding material 130' includes a chemical vapor deposition process, a physical vapor deposition process, or the like, but is not limited thereto.

Next, as shown in FIG. 5, the shielding material 130' is patterned to form a shielding layer 130. The shielding layer 130 has at least an opening 131 that exposes the light emitting element 120. The collimator 154 of FIG. 3C is then adhered to the shielding layer 130 to form the light emitting device 100 shown in FIGS. 1A and 1B or the light emitting device 100' shown in FIGS. 2A and 2B.

From the embodiments described above, the light emitting device disclosed herein possesses excellent heat dissipation efficiency to avoid the undesirable impact on the luminous efficiency and stability due to a high temperature. In addition, the total thickness of the light emitting device is reduced, which complies with the trend of thin devices. Furthermore, the shielding layer can effectively improve the light interference. Therefore, the light emitting device disclosed herein is suitable for the application of face recognition.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A light emitting device, comprising:
   a substrate;
   a light emitting element embedded in the substrate;
   a shielding layer disposed on the substrate and having an opening exposing the light emitting element; and
   a collimator disposed on the shielding layer.

2. The light emitting device of claim 1, wherein the collimator is a light transmissive layer having a plurality of convex portions, and each of the convex portions has a curved top surface.

3. The light emitting device of claim 2, wherein one of the convex portions corresponds to the opening.

4. The light emitting device of claim 2, wherein each of the convex portions has a rectangular contour in a top view.

5. The light emitting device of claim 1, wherein the collimator is a lens.

6. The light emitting device of claim 5, wherein the lens corresponds to the opening.

7. The light emitting device of claim 5, wherein the lens has a circular or elliptical contour in a top view.

8. The light emitting device of claim 1, wherein the light emitting element is a vertical-cavity surface-emitting laser diode.

9. A manufacturing method of a light emitting device, the method comprising:
   providing a precursor structure, wherein the precursor structure includes a substrate and a light emitting element embedded in the substrate;
   forming a shielding layer on the precursor structure, wherein the shielding layer has an opening exposing the light emitting element; and
   forming a collimator on the shielding layer.

10. The manufacturing method of claim 9, wherein
   the collimator is a light transmissive layer having a plurality of convex portions, and one of the convex portions is aligned with the opening; or
   the collimator is a lens aligned with the opening.

* * * * *